United States Patent
Zhang et al.

(10) Patent No.: US 11,402,567 B2
(45) Date of Patent: Aug. 2, 2022

(54) BACKLIGHT ASSEMBLY AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhuqing Zhang, Beijing (CN); Yucheng Li, Beijing (CN); Fei Pan, Beijing (CN); Shikang Ge, Beijing (CN); Hening Zhang, Beijing (CN); Xufeng Tu, Beijing (CN); Zhi Li, Beijing (CN); Wei Dai, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/310,372

(22) PCT Filed: Jan. 19, 2021

(86) PCT No.: PCT/CN2021/072675
§ 371 (c)(1),
(2) Date: Jul. 29, 2021

(87) PCT Pub. No.: WO2021/147848
PCT Pub. Date: Jul. 29, 2021

(65) Prior Publication Data
US 2022/0120957 A1 Apr. 21, 2022

(30) Foreign Application Priority Data
Jan. 20, 2020 (CN) .......................... 202020129545.3

(51) Int. Cl.
*F21V 8/00* (2006.01)
*G02F 1/13357* (2006.01)
*H05K 1/02* (2006.01)

(52) U.S. Cl.
CPC ......... *G02B 6/0055* (2013.01); *G02B 6/0066* (2013.01); *G02B 6/0083* (2013.01);
(Continued)

(58) Field of Classification Search
CPC ................ G02B 6/0055; G02B 6/0091; G02F 1/133605; G02F 1/133615; H05K 1/028
See application file for complete search history.

(56) References Cited

U.S. PATENT DOCUMENTS

| 2001/0030859 A1 | 10/2001 | Fukuyoshi |
| 2006/0094146 A1 | 5/2006 | Cho et al. |

(Continued)

FOREIGN PATENT DOCUMENTS

| CN | 1987600 A | 6/2007 |
| CN | 102086993 A | 6/2011 |

(Continued)

OTHER PUBLICATIONS

Components 101, website, https://components101.com/diodes/1-watt-led, Mar. 17, 2018 (Year: 2018).*

*Primary Examiner* — Keith G. Delahoussaye
(74) *Attorney, Agent, or Firm* — Nath, Goldberg & Meyer; Joshua B. Goldberg

(57) ABSTRACT

A backlight assembly and a display device are provided. The backlight assembly includes a light guide plate, a light source, and a first reflector sheet. The light guide plate includes a bottom surface and a light emitting surface opposite to each other, and a light incident surface intersecting the bottom surface and the light emitting surface. The light source is on the light incident surface of the light
(Continued)

guide plate. The first reflector sheet is on the bottom surface of the light guide plate and at an end of the light guide plate distal to the light source. The backlight assembly further includes a second reflector sheet proximal to the light source. The second reflector sheet is on the bottom surface and/or the light emitting surface of the light guide plate, and a reflectivity of the second reflector sheet is greater than 90%.

20 Claims, 1 Drawing Sheet

(52) U.S. Cl.
CPC ....... *G02F 1/133615* (2013.01); *H05K 1/028* (2013.01); *G02F 1/133605* (2013.01)

(56) References Cited

U.S. PATENT DOCUMENTS

| | | | |
|---|---|---|---|
| 2010/0110334 A1* | 5/2010 | Oki | G06F 1/1601 362/606 |
| 2016/0057872 A1* | 2/2016 | Park | G02B 6/0083 361/752 |
| 2021/0200025 A1* | 7/2021 | Sugiyama | G02B 6/0095 |

FOREIGN PATENT DOCUMENTS

| | | |
|---|---|---|
| CN | 103032766 A | 4/2013 |
| CN | 204477814 U | 7/2015 |
| CN | 211123566 U | 7/2020 |

\* cited by examiner

BACKLIGHT ASSEMBLY AND DISPLAY DEVICE

CROSS REFERENCE TO RELATED APPLICATIONS

This is a National Phase Application filed under 35 U.S.C. 371 as a national stage of PCT/CN2020/072675, filed Jan. 19, 2021, an application claiming the benefit of Chinese Application No. 202020129545.3, filed Jan. 20, 2020, the content of each of which is hereby incorporated by reference in its entirety.

TECHNICAL FIELD

The present disclosure relates to the field of display technology, and in particular, to a backlight assembly and a display device.

BACKGROUND

In recent years, with the progress of display technology, there has been an increasing demand for various performances (e.g., a high brightness, a low power consumption, etc.) of a display device.

An existing liquid crystal display panel generally includes a first substrate and a second substrate which are aligned with each other and assembled into a cell, and a liquid crystal layer located between the first substrate and the second substrate. A rotation angle of liquid crystal molecules in a region where the liquid crystal molecules are located may be changed by controlling an electric field in the region, so as to achieve displaying of an image on the liquid crystal display panel. In order to improve a brightness of the liquid crystal display panel and reduce a power consumption thereof at the same time, it is necessary to improve a backlight assembly providing backlight to the liquid crystal display panel.

SUMMARY

A first aspect of the present disclosure provides a backlight assembly, which includes: a light guide plate, a light source, and a first reflector sheet, wherein the light guide plate includes a bottom surface and a light emitting surface opposite to each other, and a light incident surface intersecting the bottom surface and the light emitting surface; the light source is on the light incident surface of the light guide plate; the first reflector sheet is on the bottom surface of the light guide plate and at an end of the light guide plate distal to the light source;

the backlight assembly further includes a second reflector sheet proximal to the light source; and the second reflector sheet is on the bottom surface and/or the light emitting surface of the light guide plate, and a reflectivity of the second reflector sheet is greater than 90%.

In an embodiment, the backlight assembly further includes a flexible circuit board, wherein the flexible circuit board is on the bottom surface of the light guide plate and is at an end of the light guide plate proximal to the light source; and the flexible circuit board and the first reflector sheet have a gap therebetween.

In an embodiment, in a case where the second reflector sheet is only on the bottom surface of the light guide plate, the backlight assembly further includes a first optical adhesive tape opposite to the second reflector sheet;

the first optical adhesive tape is on the light emitting surface of the light guide plate; and the second reflector sheet is between the bottom surface of the light guide plate and the flexible circuit, board, extends into the gap between the flexible circuit board and the first reflector sheet, and at least partially overlaps a side of the first reflector sheet distal to the bottom surface of the light guide plate.

In an embodiment, in a case where the second reflector sheet is only on the light emitting surface of the light guide plate, the backlight assembly further includes a second optical adhesive tape opposite to the second reflector sheet; and the second optical adhesive tape is between the bottom surface of the light guide plate and the flexible circuit board, extends into the gap between the flexible circuit board and the first reflector sheet, and at least partially overlaps a side of the first reflector sheet distal to the bottom surface of the light guide plate.

In an embodiment, the second reflector sheet includes a silver reflector sheet.

In an embodiment, the backlight assembly further includes a flexible circuit board, wherein the flexible circuit board includes a main body portion, a first extension portion, and a second extension portion; the main body portion is on the bottom surface of the light guide plate, the first extension portion is on a side of the light source distal to the light guide plate, and the second extension portion is on the light emitting surface of the light guide plate; and the main body portion and the first reflector sheet have a gap therebetween; and the second reflector sheet is on a side, which is proximal to the light guide plate, of each of the main body portion, the first extension portion and the second extension portion, extends into the gap between the main body portion and the first reflector sheet, and at least partially overlaps a side of the first reflector sheet distal to the bottom surface of the light guide plate.

In an embodiment, the main body portion, the first extension portion and the second extension portion of the flexible circuit board and the second reflector sheet have a one-piece structure.

In an embodiment, the second reflector sheet is a white reflector sheet, and a material of the white reflector sheet includes a white paint.

In an embodiment, the second reflector sheet is a silver reflector sheet.

In an embodiment, the backlight assembly further includes a fixing element, wherein the fixing element includes a first installation portion and a second installation portion opposite to each other, and a connection portion intersecting the first installation portion and the second installation portion; and the light guide plate, the light source and the first reflector sheet are fixed on the first installation portion.

In an embodiment, the fixing element is U-shaped.

In an embodiment, the backlight assembly further includes an optical film opposite to the first reflector sheet, wherein the optical film is on the light emitting surface of the light guide plate.

In an embodiment, the optical film is at the end of the light guide plate distal to the light source.

In an embodiment, the optical film includes a first diffuser, a prism, and a second diffuser that are on the light guide plate in sequence.

In an embodiment, the light source has a power less than or equal to 1 watt.

In an embodiment, the light source has a height less than a height of the light guide plate in a direction perpendicular to the bottom surface or the light emitting surface of the light guide plate.

In an embodiment, the light source is in contact with the light incident surface of the light guide plate.

A second aspect of the present disclosure provides a display device, which includes the backlight assembly according to any one of the foregoing embodiments of the first aspect of the present disclosure.

DETAILED DESCRIPTION

To enable one of ordinary skill in the art to better understand technical solutions of the present disclosure, the present disclosure will be further described in detail below with reference to the accompanying drawings and exemplary embodiments.

The liquid crystal display panel achieves a display function by controlling rotation of liquid crystal molecules with an electric field. Light transmitted by the display panel is generally polarized light, and polarizers are generally disposed at positions corresponding to (e.g., proximal to) the first substrate and the second substrate, respectively. A lower polarizer (i.e., one of the polarizers closer to the backlight assembly) filters circularly polarized light generated by the backlight assembly to obtain linearly polarized light. Since the polarizer has a filtering effect on the circularly polarized light, most of the light emitted from the backlight assembly is filtered out, and 55% of an energy of the light may be lost in this process. In addition, when the light passes through an upper polarizer (i.e., one of the polarizers farther from the backlight assembly), the light is absorbed by 10%, which results in a high requirement of the liquid crystal display on a brightness of the backlight.

An existing scheme for improving the brightness of the backlight mainly focuses on an optical film, a light source, and/or a light guide plate. However, the existing scheme for improving the brightness has encountered a bottleneck, and is unlikely to achieve a significant improvement in these aspects. For the optical film, the light source, or the light guide plate, an improvement in the brightness is usually accompanied with the problems of increased difficulty in a process, increased cost, increased complexity in a manufacturing process, and the like. In order to solve at least the above problems in the prior art, embodiments of the present disclosure provide a backlight assembly and a display device. The technical solutions of the present disclosure will be described in further detail below with reference to the accompanying drawings and exemplary embodiments.

Figure 1:
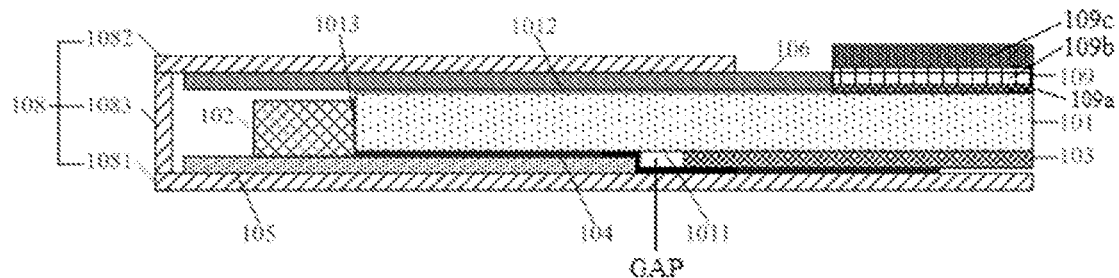
FIG. 1 is a schematic diagram showing a structure of a first backlight assembly provided by the present disclosure.
Figure 2:
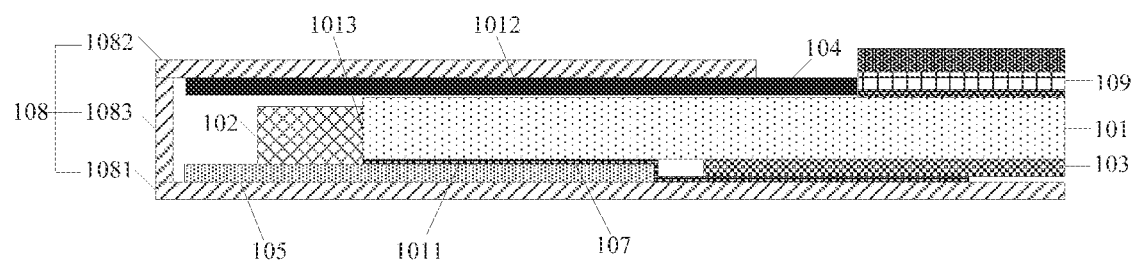
FIG. 2 is a schematic diagram showing a structure of a second backlight assembly provided by the present disclosure.
Figure 3:
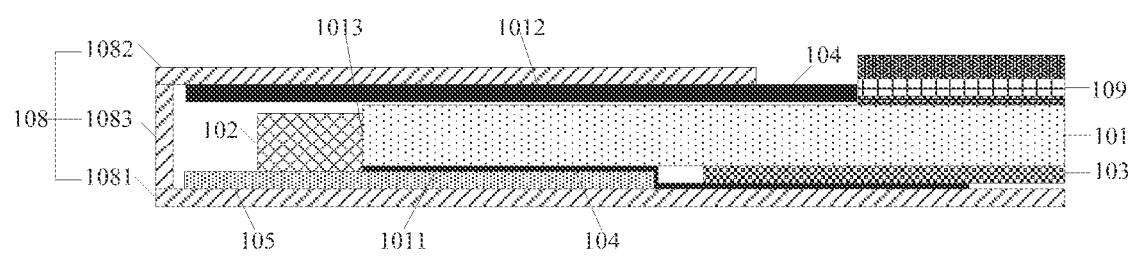
FIG. 3 is a schematic diagram showing a structure of a third backlight assembly provided by the present disclosure.

As shown in FIGS. 1 to 3, the backlight assembly according to some embodiments of the present disclosure may include: a light guide plate 101, a light source 102, and a first reflector sheet 103. The light guide plate 101 may include: a bottom surface 1011 and a light emitting surface 1012 arranged opposite to each other, and a light incident surface 1013 intersecting the bottom surface 1011 and the light emitting surface 1012. The light source 102 is located on the light incident surface 1013 of the light guide plate 101. The first reflector sheet 103 is located on a side where the bottom surface 1011 of the light guide plate 101 is located (e.g., located on the bottom surface 1011 of the light guide plate 101) and at an end of the light guide plate 101 distal to the light source 102 (e.g., at a right end of the light guide plate 101 shown in FIG. 1). The backlight assembly may further include a second reflector sheet 104 proximal to the light source 102 (e.g., at an end of the light guide plate 101 proximal to the light source 102), and the second reflector sheet 104 is disposed on the bottom surface 1011 and/or the light emitting surface 1012 of the light guide plate 101. For example, in the backlight assembly shown in FIG. 1, the second reflector sheet 104 is located on the bottom surface 1011 of the light guide plate 101. In the backlight assembly shown in FIG. 2, the second reflector sheet 104 is located on the light emitting surface 1012 of the light guide plate 101. In the backlight assembly shown in FIG. 3, the second reflector sheet 104 includes a portion located on the bottom surface 1011 of the light guide plate 101 and a portion located on the light emitting surface 1012 of the light guide plate 101. For example, the second reflector sheet 104 has a reflectivity of greater than 90%.

In the backlight assembly provided by the embodiments of the present disclosure, light generated by the light source 102 may enter from a side where the light incident surface 1013 of the light guide plate 101 is located into the light guide plate 101, be propagated by total internal reflection in the light guide plate 101 to positions (which may be provided with textures that prevent the light from being totally reflected) corresponding to a display region of a display panel, and exit from these positions out of the light guide plate 101 so as to provide backlight to the display panel. As described above, the first reflector sheet 103 may be located at the end of the light guide plate 101 distal to the light source 102 (e.g., the right end of the light guide plate 101 shown in FIG. 1) and on a side where the bottom surface 1011 of the light guide plate 101 is located. Thus, the first reflector sheet 103 may reflect light leaking from a portion of the bottom surface 1011 of the light guide plate 101 distal to the light source 102 back into the light guide plate 101, such that a utilization rate of the light from the light source 102 may be improved. The second reflector sheet 104 is closer to the light source 102 than the first reflector sheet 103, and is located on a side where the bottom surface 1011 of the light guide plate 101 is located and/or a side where the light emitting surface 1012 of the light guide plate 101 is located. Further, a reflectivity of the second reflector sheet 104 to visible light is greater than 90%, i.e., the second reflector sheet 104 has a high reflectivity. As such, the second reflector sheet 104 can reflect the light generated by the light source 102 and not directly incident into the light guide plate 101 and the light leaking from a portion of the bottom surface 1011 and/or a portion of the light emitting surface 1012 of the light guide plate 101 proximal to the light source 102 back into the light guide plate 101. Therefore, the backlight assembly provided by the embodiments of the present disclosure can improve a light incidence efficiency of the light guide plate 101, thereby improving the brightness of the backlight provided to the display panel and thus reducing the power consumption of the light source 102. Further, the backlight assembly provided by the embodiments of the present disclosure has the advantages of simple structure, low manufacturing difficulty, and high mass production yield, and thus the manufacturing cost thereof can be saved.

In an embodiment, the backlight assembly may further include: a flexible circuit board 105. The flexible circuit board 105 is located on a side where the bottom surface 1011 of the light guide plate 101 is located and may be located at the end of the light guide plate 101 proximal to the light source 102, and a gap GAP is provided between the flexible circuit board 105 and the first reflector sheet 103. That is, the flexible circuit board 105 and the first reflector sheet 103 are spaced apart from each other in a direction (e.g., a horizontal direction in FIG. 1) parallel to the bottom surface 1011 of the light guide plate 101.

It should be noted that the flexible circuit board 105 may be connected to an external voltage terminal to supply power to the light source 102, such that the light source 102 emits light. Generally, the flexible circuit board 105 is disposed on the bottom surface 1011 of the light guide plate 101, and the light source 102 may be disposed on the flexible circuit board 105. The gap GAP is formed between the flexible circuit board 105 and the first reflector sheet 103, such that the first reflector sheet 103 is prevented from overlapping the flexible circuit board 105 to form a step, which may cause a portion of the light guide plate 101 to protrude upward. As such, the case where the light emitted from the light source 102 cannot completely enter into the light guide plate 101 or the case of accidental light leakage from the light guide plate 101 can be avoided, and meanwhile the risk of generating noise due to an interference between the light guide plate 101 and another optical adhesive tape can be avoided.

In an embodiment, in a case where the second reflector sheet 104 is located on only the side where the bottom surface 1011 of the light guide plate 101 is located (as shown in FIG. 1), the backlight assembly further includes a first optical adhesive tape 106 disposed opposite to the second reflector sheet 104, and the first optical adhesive tape 106 is located on the side where the light emitting surface 1012 of the light guide plate 101 is located. The second reflector sheet 104 is located between the bottom surface 1011 of the light guide plate 101 and the flexible circuit board 105, extends into the gap GAP between the flexible circuit board 105 and the first reflector sheet 103, and at least partially overlaps a side of the first reflector sheet 103 distal to the bottom surface 1011 of the light guide plate 101.

It should be noted that, as shown in FIG. 1, the second reflector sheet 104 may be located only on the bottom surface 1011 of the light guide plate 101, and can reflect the light that is emitted from the light source 102 but is not directly incident into the light guide plate 101 and the light that leaks out from the bottom surface 1011 of the light guide plate 101 back into the light guide plate 101 again, so as to improve the utilization rate of the light from the light source 102, thereby improving the brightness of the backlight provided to the display panel and thus reducing the power consumption of the light source 102. Further, the second reflector sheet 104 may extend into the gap GAP between the flexible circuit board 105 and the first reflector sheet 103 and at least partially overlap the first reflector sheet 103. In this way, the second reflector sheet 104 can reflect the light leaking from a portion of the bottom surface 1011 of the light guide plate 101 corresponding to the gap GAP between the flexible circuit board 105 and the first reflector sheet 103 back into the light guide plate 101, so as to improve the utilization rate of the light source 102. Meanwhile, the second reflector sheet 104 may facilitate the fixing of the flexible circuit board 105. In a practical application, the first optical adhesive tape 106 may be a light-shielding tape, which can absorb light leaking from the side where the light emitting surface 1012 of the light guide plate 101 is located, so as to avoid the defects such as edge bright lines due to light leakage. Alternatively, the first optical adhesive tape 106 may be a reflective tape, which can reflect the light leaking from the side where the light emitting surface 1012 of the light guide plate 101 is located back into the light guide plate 101, so as to improve the utilization rate of the light from the light source 102. As an example, in an embodiment of the present disclosure, the first optical adhesive tape 106 is a reflective tape.

In an embodiment, in a case where the second reflector sheet 104 is located only on the side where the light emitting surface 1012 of the light guide plate 101 is located, the backlight assembly further includes a second optical adhesive tape 107 disposed opposite to the second reflector sheet 104 (as shown in FIG. 2). The second optical adhesive tape 107 is located between the bottom surface 1011 of the light guide plate 101 and the flexible circuit board 105, extends into the gap GAP between the flexible circuit board 105 and the first reflector sheet 103, and at least partially overlaps the side of the first reflector sheet 103 distal to the bottom surface 1011 of the light guide plate 101.

It should be noted that, as shown in FIG. 2, the second reflector sheet 104 may be located only on the light emitting surface 1012 of the light guide plate 101, and can reflect the light that is emitted from the light source 102 and is not directly incident to the light guide plate 101 and the light that leaks from the light emitting surface 1012 of the light guide plate 101 back into the light guide plate 101, so as to improve the utilization rate of the light from the light source 102, thereby improving the brightness of the backlight provided to the display panel and thus reducing the power consumption of the light source 102. Further, the second optical adhesive tape 107 may extend into the gap GAP between the flexible circuit board 105 and the first reflector sheet 103 and at least partially overlap the first reflector sheet 103. As such, the second optical adhesive tape 107 can reflect the light leaking from a portion of the light guide plate 101 corresponding to the gap GAP between the flexible circuit board 105 and the first reflector sheet 103 back into the light guide plate 101, so as to improve the utilization rate of the light from the light source 102. Meanwhile, the second optical adhesive tape 107 may facilitate the fixing of the flexible circuit board. In a practical application, the second optical adhesive tape 107 may be a reflective tape, which can reflect the light leaking from the bottom surface 1011 of the light guide plate 101 back into the light guide plate 101, so as to improve the utilization rate of the light from the light source 102.

It can be understood that in the structure of the backlight assembly shown in FIG. 3, the second reflector sheet 104 is disposed on both the bottom surface 1011 and the light emitting surface 1012 of the light guide plate 101, and the implementation principle thereof is similar to those of the above two implementations, and is not repeated herein.

In an embodiment, the second reflector sheet 104 includes a silver reflector sheet. In other words, a material of the second reflector sheet 104 may include silver.

It should be noted that the second reflector sheet 104 may be a silver reflector sheet, and a reflective efficiency a reflectivity) of silver is relatively high. Taking the light generated by the light source 102 as green light with a wavelength of 555 nm as an example, a reflectivity of the silver reflector sheet for the green light is 93% to 95%, which is far greater than a reflectivity of a white reflector sheet causing diffuse reflection. In a practical application, the configuration shown in FIG. 1 may be adopted, and the combination of the silver reflector sheet and the reflective tape is utilized to reflect light back into the light guide plate 101, such that the overall light efficiency of the backlight is improved by about 8% through practical tests. The configuration shown in FIG. 2 may alternatively be adopted, and the combination of the silver reflector sheet and the white reflector sheet is utilized to reflect the light back into the light guide plate 101, such that the overall light efficiency of the backlight can be improved by about 7.5% through practical tests. The configuration shown in FIG. 3 may alternatively be adopted, silver reflector sheets are respectively disposed on both the bottom surface 1011 and the light emitting surface 1012 of the light guide plate 101 to reflect the light back into the light guide plate 101, and practical tests show that the overall light efficiency of the backlight can be improved by about 13%. It is to be understood that the second reflector sheet 104 may alternatively be another metallic reflector sheet or another non-metallic reflector sheet that has a high reflectivity, and the implementation principle thereof is similar to the foregoing description and will not be repeated again.

Figure 4:
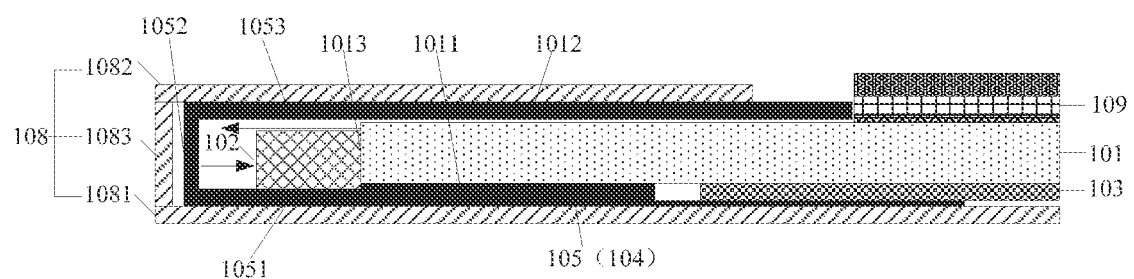
FIG. 4 is a schematic diagram showing a structure of a fourth backlight assembly provided by the present disclosure.

In an embodiment, the backlight assembly further includes the flexible circuit board 105. The flexible circuit board 105 may include a main body portion 1051, a first extension portion 1052, and a second extension portion 1053 (as shown in FIG. 4). The main body portion 1051 is located on the bottom surface 1011 of the light guide plate 101, the first extension portion 1052 is located on a side of the light source 102 distal to the light guide plate 101, and the second extension portion 1053 is located on the light emitting surface 1012 of the light guide plate 101. A gap GAP is provided between the main body portion 1051 and the first reflector sheet 103. The second reflector sheet 104 is located on a side of the main body portion 1051, the first extension portion 1052 and the second extension portion 1053 proximal to the light guide plate 101, extends into the gap GAP between the main body portion 1051 and the first reflector sheet 103, and at least partially overlaps a side of the first reflector sheet 103 distal to the bottom surface 1011 of the light guide plate 101.

As shown in FIG. 4, in the present embodiment, the flexible circuit board 105 may include the main body portion 1051, the first extension portion 1052, and the second extension portion 1053. The flexible circuit board 105 may be connected to a voltage terminal to supply power to the light source 102, such that the light source 102 provided on the main body portion 1051 emits light. Further, the second reflector sheet 104 is attached to the side of each of the portions of the flexible circuit board 105 proximal to the light guide plate 101. Portions of the second reflector sheet 104 respectively on the main body portion 1051 and the second extension portion 1053 of the flexible circuit board 105 can reflect the light leaking from the bottom surface 1011 and the light leaking from the light emitting surface 1012 of the light guide plate 101 back into the light guide plate 101, so as to reduce the light loss and improve the light incidence efficiency of the light guide plate 101. The gap GAP is provided between the main body portion 1051 and the first reflector sheet 103, which can prevent the first reflector sheet 103 from overlapping the main body portion 1051 of the flexible circuit board 105 to form a step causing a portion of the light guide plate 101 to protrude upward. As such, not only a case where the light emitted from the light source 102 cannot completely enter into the light guide plate 101 or a case of accidental light leakage from the light guide plate 101 can be avoided, but also the risk of generating noise due to an interference between the light guide plate 101 and another optical adhesive tape or another reflector sheet can be avoided. The second reflector sheet 104 may extend into the gap GAP between the main body portion 1051 and the first reflector sheet 103, and at least partially overlap the side of the first reflector sheet 103 distal to the bottom surface 1011 of the light guide plate 101. As such, a portion of the second reflector sheet 104 in this region can reflect the light leaking from the portion of the light guide plate 101 corresponding to the gap GAP between the main body portion 1051 and the first reflector sheet 103 back into the light guide plate 101 again, so as to improve the utilization rate of the light from the light source 102. In the backlight assembly provided by the present embodiment, in a direction perpendicular to the bottom surface 1011 or the light emitting surface 1012 of the light guide plate 101, a height of the light source 102 is less than a height of the light guide plate 101 (i.e., a thickness of the light source 102 is less than a thickness of the light guide plate 101), and the light source 102 is in close contact with the light incident surface 1013 of the light guide plate 101, so as to ensure that the light emitted from the light source 102 enters into the light guide plate 101 to the maximum extent. However, in a practical application, due to a tolerance and variability in a process, there is a certain distance between the light source 102 and the light guide plate 101 such that a part of the light emitted from the light source 102 may not be directly incident into the light guide plate 101. In an embodiment of the present disclosure, a portion of the second reflector sheet 104 on the first extension portion 1052 of the flexible circuit board 105 may reflect the part of the light that is not directly incident into the light guide plate 101 back into the light guide plate 101 again (as shown by the arrows in FIG. 4), such that the loss of the light can be reduced, and the light incidence efficiency of the light guide plate 101 may be improved. In the direction perpendicular to the bottom surface 1011 or the light emitting surface 1012 of the light guide plate 101, if the height of the light source 102 is equal to or greater than the height of the light guide plate 101 (i.e., the thickness of the light source 102 is equal to or greater than the thickness of the light guide plate 101), a part of the light emitted from the light source 102 will not be incident into the light guide plate 101, and thus the utilization rate of the light emitted from the light source 102 is low.

In an embodiment, the main body portion 1051, the first extension portion 1052 and the second extension portion 1053 of the flexible circuit board 105 and the second reflector sheet 104 have a one-piece structure.

It should be noted that, in a manufacturing process, the flexible circuit board 105 and the second reflector sheet 104 may be formed to have a one-piece structure, such that the difficulty of the manufacturing process may be reduced, and a thickness of each structure may be reduced. Alternatively, the second reflector sheet 104 may be formed by coating a reflective material having a high reflectivity on an inner side of the flexible circuit board 105 during a manufacturing process, or by another process, which is not listed exhaustively herein. In the manufacturing process, since the flexible circuit board 105 and the second reflector sheet 104 have a one-piece structure, the number of film layers can be reduced, and the flexible circuit board 105 can be fixed through only one layer of bonding material, which facilitates the fixing and the installation of respective components. Alternatively, on the side of main body portion 1051, the first extension portion 1052 and the second extension portion 1053 of the flexible circuit board 105 proximal to the light guide plate 101, a white paint may be coated to form a white reflector sheet or a silver paint may be coated to form a silver reflector sheet, such that the light not directly entering into the light guide plate 101 and the light leaking from the bottom surface 1011 and the light emitting surface 1012 of the light guide plate 101 are reflected back into the light guide plate 101, thereby improving the light incidence efficiency of the light guide plate 101. In a practical application, the configuration as shown in FIG. 4 may be adopted, and the white paint may be coated on the side of the main body portion 1051, the first extension portion 1052 and the second extension portion 1053 of the flexible circuit board 105 proximal to the light guide plate 101 to reflect light back into the light guide plate 101. In this case, practical tests show that the overall light efficiency of the backlight is improved by about 10% to 15%. Alternatively, the configuration as shown in FIG. 4 may be adopted, and the silver paint may be coated on the side of the main body portion 1051, the first extension portion 1052 and the second extension portion 1053 of the flexible circuit board 105 proximal to the light guide plate 101 to reflect light back into the light guide plate 101. In this case, practical tests show that the overall light efficiency of the backlight is improved by about 15% to 20%. As an example, in the present embodiment, the silver paint is coated on the side of the main body portion 1051, the first extension portion 1052 and the second extension portion 1053 of the flexible circuit board 105 proximal to the light guide plate 101, so as to reflect light into the light guide plate 101 as completely as possible. For example, a material of the flexible circuit board 105 may be a conventional material for a flexible circuit board in the art.

In an embodiment, the backlight assembly further includes: a fixing element 108. The fixing element 108 may include a first installation portion 1081 and a second installation portion 1082 disposed opposite to each other, and a connection portion 1083 intersecting (or connecting to) the first installation portion 1081 and the second installation portion 1082. The light guide plate 101, the light source 102, and the first reflector sheet 103 are fixed to the first installation portion 1081.

It should be noted that the backlight assembly may further include the fixing element 108. The fixing element 108 may be a U-shaped frame structure including the first and second installation portions 1081, 1082 disposed opposite to each other, and the connection portion 1083 intersecting (or connecting to) the first and second installation portions 1081, 1082. The light guide plate 101, the light source 102 and the first reflector sheet 103 may be fixed to the first installation portion 1081, and the first optical adhesive tape 106 or the second extension portion 1053 of the flexible circuit board 105 may be fixed to the second installation portion 1082, so as to form a structure with stability, which is favorable for integrating the backlight assembly in a display device and providing backlight for a display panel of the display device. An adhesive layer may be applied to a surface of each of the main body portion 1051 and the second extension portion 1053 of the flexible circuit board 105 distal to the light guide plate 101, such that the flexible circuit board 105 is fixed to the first installation portion 1081 of the fixing element 108. It is to be understood that the fixing element 108 may be a back plate in the prior art, and the first installation portion 1081, the second installation portion 1082 and the connection portion 1083 of the fixing element 108 may or may not have a one-piece structure, which is not limited herein.

In an embodiment, the backlight assembly may further include an optical film 109 disposed opposite to the first reflector sheet 103, and the optical film 109 is located on the light emitting surface 1012 of the light guide plate 101 and at the end of the light guide plate distal to the light source. It should be understood that in the embodiments of FIGS. 1 to 4, the light from the light source 102 is uniformized by the light guide plate 101, and then emitted upward from the right end of the light emitting surface 1012 of the light guide plate 101. Therefore, the optical film 109 is located at the end of the light guide plate distal to the light source (i.e., at the right end of the light emitting surface 1012 of the light guide plate 101 shown in each of FIGS. 1 to 4), such that a brightness of the light emitted from the optical film 109 is more uniform or higher.

It should be noted that the optical film 109 may be disposed on the light emitting surface 1012 of the light guide plate 101, and the optical film 109 can transmit the light emitted from the light guide plate 101 at a same angle and with a higher brightness, such that the light is applicable to a display device. As a result, more efficient backlight can be provided to a display panel on the backlight assembly, and the display effect of the display panel is improved.

In an embodiment, the optical film 109 includes a first diffuser (which may also be referred to as a first diffuser sheet) 109a, a prism (which may also be referred to as a prism sheet) 109b, and a second diffuser (which may also be referred to as a second diffuser sheet) 109c, which are sequentially disposed.

In an embodiment, the first diffuser 109a and the second diffuser 109c allow angles of emergent light rays to be more uniform, and the prism 109b can improve the brightness of the emergent light rays, such that the whole backlight assembly can provide more efficient backlight for the display panel of the display device, thereby improving the display effect thereof.

In an embodiment, the light source 102 has a power less than or equal to 1 watt.

It should be noted that the display assembly provided by the present embodiment can effectively improve the light incidence efficiency, and reduce the power consumption of the light source 102. For example, in a practical application, the power of the light source 102 may be less than or equal to 1 watt. Thus, the backlight assembly provided by the present embodiment can be applied to a display product with a low power consumption, so as to save the power consumption of the display product.

Based on the same inventive concept as that described above, an embodiment of the present disclosure provides a display device, which includes the backlight assembly provided by any one of the foregoing embodiments. For example, the display device may further include a display panel, which may be a liquid crystal display panel. The display panel may be located on a side, which is distal to the light guide plate 101, of the optical film 109 of the backlight assembly shown in any one of FIGS. 1 to 4. The display device provided by an embodiment of the present disclosure may be a mobile phone, a tablet computer, a smart television, or another terminal device, and the implementation principle of the display device is similar to that of the backlight assembly provided by any one of the foregoing embodiments, which is not repeated herein.

In the display device provided by the present embodiment, by adopting the silver reflector sheet as the second reflector sheet with a high reflectivity, the light not entering into the light guide plate and the light leaking from the bottom surface and the light emitting surface of the light guide plate can be reflected back into the light guide plate again, such that the light incidence efficiency of the light guide plate can be improved, thereby improving the brightness of the backlight provided to the display panel, and reducing the power consumption of the light source. Further, the backlight assembly of the display device provided by an embodiment of the present disclosure has the advantages of simple structure, low manufacturing difficulty, and a high mass production yield, and thus the manufacturing cost thereof can be saved.

It should be understood that the above embodiments are merely exemplary embodiments adopted to explain the principles of the present disclosure, and the present disclosure is not limited thereto. It will be apparent to one of ordinary skill in the art that various changes and modifications may be made without departing from the scope of the present disclosure as defined by the appended claims, and such changes and modifications also fall within the scope of the present disclosure.

What is claimed is:

1. A backlight assembly, comprising: a light guide plate, a light source, and a first reflector sheet,
   wherein the light guide plate comprises a bottom surface and a light emitting surface opposite to each other, and a light incident surface intersecting the bottom surface and the light emitting surface; the light source is on the light incident surface of the light guide plate; the first reflector sheet is on the bottom surface of the light guide plate and at an end of the light guide plate distal to the light source;
   the backlight assembly further comprises a second reflector sheet proximal to the light source; and
   the second reflector sheet is on at least one of the bottom surface of the light guide plate and the light emitting surface of the light guide plate, and a reflectivity of the second reflector sheet is greater than 90%,
   wherein the second reflector sheet comprises a silver reflector sheet.

2. The backlight assembly according to claim 1, further comprising a flexible circuit board, wherein
   the flexible circuit board is on the bottom surface of the light guide plate and is at an end of the light guide plate proximal to the light source; and
   the flexible circuit board and the first reflector sheet have a gap therebetween.

3. The backlight assembly according to claim 2, wherein in a case where the second reflector sheet is only on the bottom surface of the light guide plate, the backlight assembly further comprises a first optical adhesive tape opposite to the second reflector sheet;
   the first optical adhesive tape is on the light emitting surface of the light guide plate; and
   the second reflector sheet is between the bottom surface of the light guide plate and the flexible circuit board, extends into the gap between the flexible circuit board and the first reflector sheet, and at least partially overlaps a side of the first reflector sheet distal to the bottom surface of the light guide plate.

4. The backlight assembly according to claim 2, wherein in a case where the second reflector sheet is only on the light emitting surface of the light guide plate, the backlight assembly further comprises a second optical adhesive tape opposite to the second reflector sheet; and
   the second optical adhesive tape is between the bottom surface of the light guide plate and the flexible circuit board, extends into the gap between the flexible circuit board and the first reflector sheet, and at least partially overlaps a side of the first reflector sheet distal to the bottom surface of the light guide plate.

5. The backlight assembly according to claim 2, further comprising an optical film opposite to the first reflector sheet, wherein
   the optical film is on the light emitting surface of the light guide plate.

6. The backlight assembly according to claim 1, wherein the light source has a height less than a height of the light guide plate in a direction perpendicular to the bottom surface or the light emitting surface of the light guide plate.

7. The backlight assembly according to claim 1, wherein the light source is in contact with the light incident surface of the light guide plate.

8. A display device, comprising the backlight assembly according to claim 1.

9. The backlight assembly according to claim 1, wherein the light source has a power less than or equal to 1 watt.

10. The backlight assembly according to claim 1, further comprising a fixing element, wherein
    the fixing element comprises a first installation portion and a second installation portion opposite to each other, and a connection portion intersecting the first installation portion and the second installation portion; and
    the light guide plate, the light source and the first reflector sheet are fixed on the first installation portion.

11. The backlight assembly according to claim 10, wherein the fixing element is U-shaped.

12. The backlight assembly according to claim 1, further comprising an optical film opposite to the first reflector sheet, wherein
    the optical film is on the light emitting surface of the light guide plate.

13. The backlight assembly according to claim 12, wherein the optical film is at the end of the light guide plate distal to the light source.

14. The backlight assembly according to claim 12, wherein the optical film comprises a first diffuser, a prism, and a second diffuser that are on the light guide plate in sequence.

15. A backlight assembly, comprising a light guide plate, a light source, and a first reflector sheet,
    wherein the light guide plate comprises a bottom surface and a light emitting surface opposite to each other, and a light incident surface intersecting the bottom surface and the light emitting surface; the light source is on the light incident surface of the light guide plate; the first reflector sheet is on the bottom surface of the light guide plate and at an end of the light guide plate distal to the light source;
    the backlight assembly further comprises a second reflector sheet proximal to the light source; and
    the second reflector sheet is on at least one of the bottom surface of the light guide plate and the light emitting surface of the light guide plate, and a reflectivity of the second reflector sheet is greater than 90%,
    the backlight assembly further comprises a flexible circuit board, wherein the flexible circuit board comprises a main body portion, a first extension portion, and a second extension portion; the main body portion is on the bottom surface of the light guide plate, the first extension portion is on a side of the light source distal to the light guide plate, and the second extension portion is on the light emitting surface of the light guide plate; and the main body portion and the first reflector sheet have a gap therebetween; and the second reflector sheet is on a side, which is proximal to the light guide plate, of each of the main body portion, the first extension portion and the second extension portion, extends into the gap between the main body portion and the first reflector sheet, and at least partially overlaps a side of the first reflector sheet distal to the bottom surface of the light guide plate.

16. The backlight assembly according to claim 15, wherein the main body portion, the first extension portion and the second extension portion of the flexible circuit board and the second reflector sheet have a one-piece structure.

17. The backlight assembly according to claim 16, wherein the second reflector sheet is a white reflector sheet, and a material of the white reflector sheet comprises a white paint.

18. The backlight assembly according to claim 16, wherein the second reflector sheet is a silver reflector sheet.

19. The backlight assembly according to claim 15, further comprising a fixing element, wherein the fixing element comprises a first installation portion and a second installation portion opposite to each other, and a connection portion intersecting the first installation portion and the second installation portion; and the light guide plate, the light source and the first reflector sheet are fixed on the first installation portion.

20. A display device, comprising the backlight assembly according to claim 15.

* * * * *